(12) United States Patent
Nishikawa et al.

(10) Patent No.: US 11,254,579 B2
(45) Date of Patent: Feb. 22, 2022

(54) CORE WIRE FOR USE IN SILICON DEPOSITION, METHOD FOR PRODUCING SAID CORE WIRE, AND METHOD FOR PRODUCING POLYCRYSTALLINE SILICON

(71) Applicant: TOKUYAMA CORPORATION, Yamaguchi (JP)

(72) Inventors: Masayoshi Nishikawa, Yamaguchi (JP); Yuji Inoue, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 90 days.

(21) Appl. No.: 16/484,065

(22) PCT Filed: Feb. 14, 2018

(86) PCT No.: PCT/JP2018/005048
§ 371 (c)(1),
(2) Date: Aug. 6, 2019

(87) PCT Pub. No.: WO2018/151140
PCT Pub. Date: Aug. 23, 2018

(65) Prior Publication Data
US 2020/0002178 A1 Jan. 2, 2020

(30) Foreign Application Priority Data
Feb. 20, 2017 (JP) .............................. JP2017-029470

(51) Int. Cl.
*C30B 29/06* (2006.01)
*C01B 33/035* (2006.01)
(Continued)

(52) U.S. Cl.
CPC ............ *C01B 33/035* (2013.01); *C23C 16/24* (2013.01); *C30B 25/005* (2013.01)

(58) Field of Classification Search
CPC ...... C23C 16/24; C01B 33/035; C30B 25/005; C30B 29/06; C30B 29/605
See application file for complete search history.

(56) References Cited

U.S. PATENT DOCUMENTS 5,667,585 A * 9/1997 Fukuda .................. C30B 13/00
117/49
2006/0211218 A1 9/2006 Boyle et al.
(Continued)

FOREIGN PATENT DOCUMENTS

JP 2005-112662 4/2005
JP 2009263149 A 11/2009
(Continued)

OTHER PUBLICATIONS

"Grain size dependence of the photovoltaic properties of solar grade polysilicon", Kumari, S.; Arora, N. K.; Jain, G. C., Solar Energy Materials, vol. 5, Oct. 1981, p. 383-390. (Year: 1981).*
(Continued)

*Primary Examiner* — Robert M Kunemund
(74) *Attorney, Agent, or Firm* — Casimir Jones, SC; Robert A. Goetz (57) ABSTRACT

Efficiency of producing polycrystalline silicon is improved. A silicon filament (11) is constituted by a rod-shaped member made of polycrystalline silicon. The polycrystalline silicon has an interstitial oxygen concentration of not less than 10 ppma and not more than 40 ppma. On a side surface, in a lengthwise direction, of the rod-shaped member, crystal grains each having a crystal grain size of not less than 1 mm are observed.

4 Claims, 3 Drawing Sheets

(1) CUT POLYCRYSTALLINE SILICON INGOT

20

(2) CUT OUT FILAMENT

21

(3) AFTER-TREATMENT

11

(51) Int. Cl.
  *C23C 16/24* (2006.01)
  *C30B 25/00* (2006.01)

(56) References Cited

U.S. PATENT DOCUMENTS

| | | |
|---|---|---|
| 2008/0152805 A1 | 6/2008 | Boyle et al. |
| 2009/0269493 A1* | 10/2009 | Mizuno .................. C01B 33/03 |
| 2010/0009123 A1 | 1/2010 | Boyle et al. |
| 2013/0277889 A1 | 10/2013 | Vaisberg |
| 2014/0004377 A1 | 1/2014 | Kaito |

FOREIGN PATENT DOCUMENTS

| | | | |
|---|---|---|---|
| JP | 2013252990 A | 12/2013 | |
| JP | 2014028747 A | 2/2014 | |
| JP | 2016133021 A | 8/2016 | |
| TW | 200632151 A | 9/2006 | |
| WO | 2011071098 A1 | 6/2011 | |

OTHER PUBLICATIONS

International Search Report PCT/JP2018/005048 dated Mar. 13, 2018. Japan Patent Office Tokyo 100-8915 Japan.
English Translation of International Preliminary Report on Patentability for PCT/JP2018/005048 dated Aug. 29, 2019. The International Bureau of WIPO Geneva 20 Switzerland.
Extended EP Search Report, EP Patent Application No. 18754364.0, dated Oct. 2, 2020, 7 pages.
Office Action for TW Patent Application No. 107105180, dated Jan. 29, 2021, 9 pages.

\* cited by examiner

FIG. 1

WASTE GAS   SOURCE GAS (b)

(1) CUT POLYCRYSTALLINE SILICON INGOT (2) CUT OUT FILAMENT (3) AFTER-TREATMENT

FIG. 5

CORE WIRE FOR USE IN SILICON DEPOSITION, METHOD FOR PRODUCING SAID CORE WIRE, AND METHOD FOR PRODUCING POLYCRYSTALLINE SILICON

TECHNICAL FIELD

The present invention relates to a filament for deposition of silicon (hereinafter, referred to as a silicon deposition filament) which is used to produce polycrystalline silicon, (ii) a method for producing the filament, and (iii) a method for producing polycrystalline silicon.

BACKGROUND ART

As a method for industrially producing polycrystalline silicon which is used as a raw material of a semiconductor or as a raw material of a wafer for photovoltaic power generation, the Siemens process is known. According to the Siemens process, an electric current is passed through a silicon deposition filament (hereinafter, also referred to as a "silicon filament"), which is disposed in a standing manner in a bell-shaped (bell-jar-shaped) chemical reactor, so that the silicon deposition filament is heated to a silicon deposition temperature (approximately not lower than 600° C.) at which silicon is deposited, and a source gas containing (i) a gas of a silane compound and (ii) hydrogen is fed into the chemical reactor. The Siemens process is a process of thus depositing and vapor-phase growing polycrystalline silicon on a surface of a silicon filament by CVD (Chemical Vapor Deposition) (see Patent Literature 1).

Such a silicon filament used in the Siemens process is produced mainly by any one of the following two types of methods (i) and (ii).

(i) One is a method in which a silicon filament is cut out from a polycrystalline silicon rod produced by the Siemens process. Generally, the method (i) is a method in which a single batch of polycrystalline silicon rods, obtained in one of a plurality of chemical reactors, are each employed as a polycrystalline silicon rod for production of a silicon filament. In each of the plurality of chemical reactors, a plurality of silicon filaments are disposed in a standing manner, and a silicon deposition reaction is carried out. A batch of polycrystalline silicon rods, each of which is used in this method to produce a silicon filament, may be referred to as a filament production batch in the following description.

(ii) The other method is a method in which a bulk crystal of single-crystal silicon (single-crystal silicon ingot) is produced by the Czochralski method (hereinafter, also referred to as a CZ method) and the single-crystal silicon ingot is processed to produce a silicon filament.

CITATION LIST

Patent Literature

[Patent Literature 1] Japanese Patent Application Publication, Tokukai, No. 2016-138021

SUMMARY OF INVENTION

Technical Problem

With an increase in demand for polycrystalline silicon, various techniques for increasing efficiency of producing polycrystalline silicon have been suggested. However, a further improvement in production efficiency has been desired.

However, in a case where a silicon filament which is produced by the above method (i) is used, there is a problem that efficiency of producing polycrystalline silicon is decreased, because (a) a filament production batch is provided and (b) the silicon filament is produced with use of an apparatus for producing polycrystalline silicon.

On the other hand, a silicon filament which is obtained by the above method (ii) is prone to creep deformation at a high temperature due to its physical property that the silicon filament is constituted by a single crystal. This may result in collapse of the silicon filament in a chemical reactor at a temperature of not lower than 800° C. Therefore, in a case where polycrystalline silicon is produced by the Siemens process, a temperature condition and the like are restricted, and speeding up a polycrystalline silicon deposition reaction is prevented. As such, it is difficult to improve efficiency of producing polycrystalline silicon.

An aspect of the present invention has been made in view of the above conventional problems, and an object of the aspect of the present invention is to realize an improvement in efficiency of producing polycrystalline silicon.

Solution to Problem

As a result of conducting diligent studies, the inventors of the present invention found the following matters, when producing a silicon filament by a method other than the Siemens process. That is, a silicon filament is produced by randomly dispersing crystal grains and controlling an interstitial oxygen concentration so that the interstitial oxygen concentration decreases to fall within a specific range. The inventors of the present invention found that this allows obtainment of a silicon filament which has an excellent mechanical characteristic equivalent to a silicon filament produced by the Siemens process, while having characteristics different from those of the silicon filament produced by the Siemens process. As a result, the inventors of the present invention accomplished the present invention.

A silicon deposition filament in accordance with an aspect of the present invention is a silicon deposition filament being constituted by a rod-shaped member made of polycrystalline silicon, the polycrystalline silicon having an interstitial oxygen concentration of not less than 10 ppma and not more than 40 ppma, on a side surface, in a lengthwise direction, of the rod-shaped member, crystal grains each having a crystal grain size of not less than 1 mm being observed.

A method for producing a silicon deposition filament in accordance with an aspect of the present invention is a method for producing a silicon deposition filament, the method including the steps of: producing a polycrystalline silicon ingot, which contains crystal grains each having a crystal grain size of not less than 1 mm and which has an interstitial oxygen concentration of not less than 10 ppma and not more than 40 ppma, by a Czochralski method in which polycrystalline silicon is used as a seed crystal; and processing the polycrystalline silicon ingot into a rod-shaped member.

Advantageous Effects of Invention

According to an aspect of the present invention, it is possible to easily provide a silicon filament which has an excellent mechanical characteristic at a high temperature. This makes it unnecessary to provide a filament production batch as described above, and makes it possible to improve efficiency of producing polycrystalline silicon by the Siemens process.

BRIEF DESCRIPTION OF DRAWINGS (a) of FIG. 1 is a cross-sectional view schematically illustrating an internal structure of a chemical reactor for producing polycrystalline silicon. (b) of FIG. 1 is a perspective view illustrating a member for deposition of silicon which member is constituted by silicon filaments and which member is disposed in a standing manner in the chemical reactor.

(a) of FIG. 3 is a transverse cross-sectional view of a polycrystalline silicon ingot serving as a material from which a silicon filament in accordance with an embodiment of the present invention is produced. (b) of FIG. 3 is a schematic view illustrating a side surface, in a lengthwise direction, of the silicon filament.

DESCRIPTION OF EMBODIMENTS

The following description will discuss an embodiment of the present invention. Note that, unless otherwise specified, the present invention is not limited to the following description, which is provided so that subject matters of the present invention are better understood. Note also that an expression of a numerical range, such as "A to B", as used herein means "not less than A and not more than B".

<Polycrystalline Silicon Producing Device>

Figure 1:
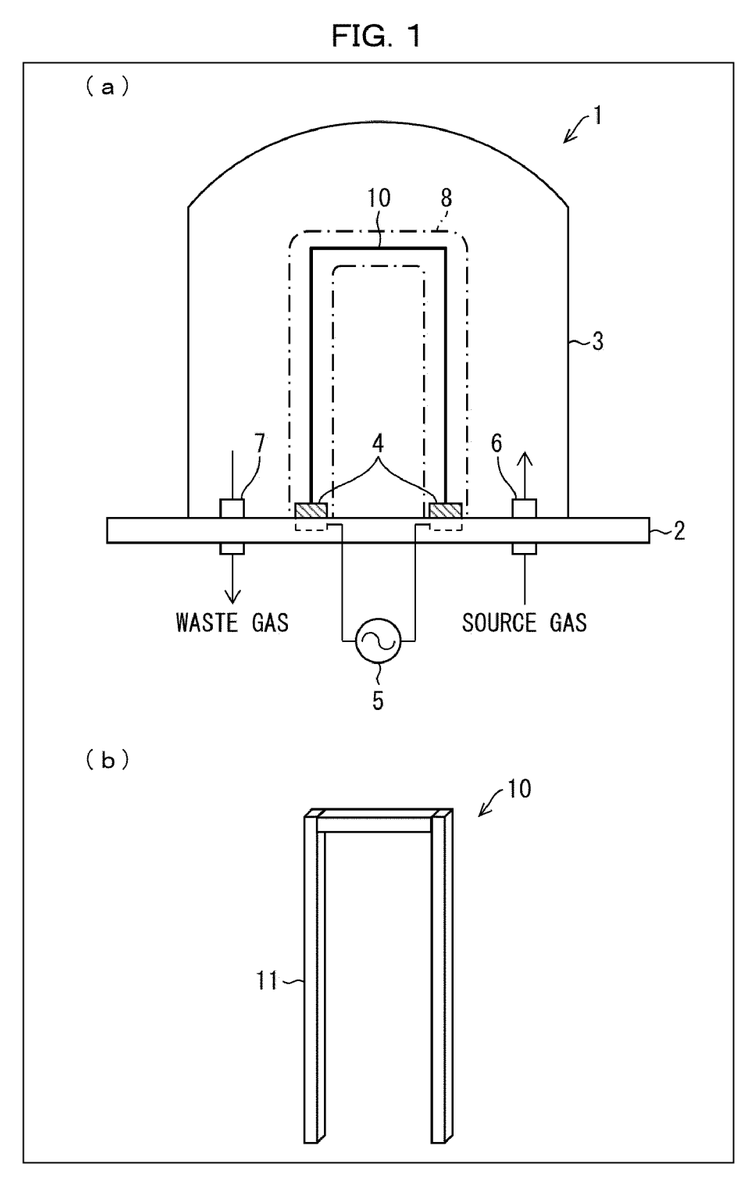
Figure 2:
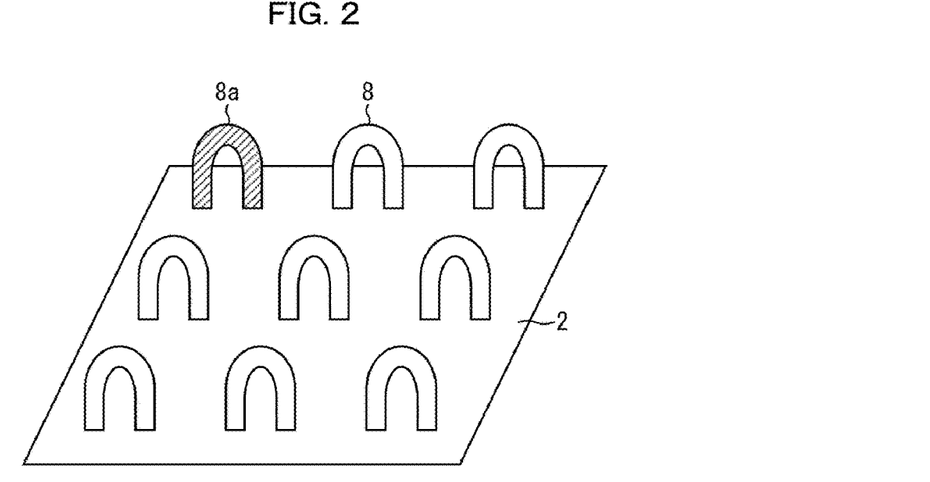
FIG. 2 is a perspective view schematically illustrating an inside of the chemical reactor.

For the purpose of aiding in understanding a silicon deposition filament (hereinafter, simply referred to as a "silicon filament") in accordance with an embodiment of the present invention, an example of an apparatus for producing a polycrystalline silicon rod used in the Siemens process will be first briefly described with reference to (a) and (b) of FIG. 1 and FIG. 2. (a) of FIG. 1 is a cross-sectional view schematically illustrating a structure of a chemical reactor for producing polycrystalline silicon, as an example of the apparatus for producing a polycrystalline silicon rod. (b) of FIG. 1 is a perspective view illustrating a member for deposition of silicon (hereinafter, referred to as a silicon deposition member) which is constituted by silicon filaments and which is disposed in a standing manner in the chemical reactor. FIG. 2 is a perspective view schematically illustrating an inside of the chemical reactor. Note that FIG. 2 illustrates a state where a cover of the chemical reactor is removed.

As illustrated in (a) of FIG. 1, a chemical reactor (chemical reactor for producing polycrystalline silicon) 1 has a bottom plate 2 and a cover 3 which has a bell-jar shape and which is removably coupled to the bottom plate 2.

A source gas feeding port 6 and a waste gas discharging port 7 are fitted in the bottom plate 2. The source gas feeding port 6 is a port through which a source gas is fed into the chemical reactor 1. The waste gas discharging port 7 is a port through which a waste gas, which is a gas produced as a result of a reaction carried out in the chemical reactor 1, is discharged. The source gas is a mixed gas containing (i) a gas of a silane compound and (ii) hydrogen. Examples of the silane compound include chlorosilane compounds, such as trichlorosilane ($SiHCl_3$), and monosilane ($SiH_4$).

At least one pair of electrodes 4 are provided on the bottom plate 2. A silicon deposition member 10, which is constituted by silicon filaments, is connected to the at least one pair of electrodes 4. Therefore, the number of pairs of electrodes 4 is determined so that the number of pairs of electrodes 4 corresponds to the number of silicon deposition members 10 disposed in the chemical reactor 1. The at least one pair of electrodes 4 are connected to an electric power supplying section 5 so that an electric current can be passed through the at least one pair of electrodes 4.

Silicon filaments 11 are processed so that the silicon filaments 11 have, for example, a U shape (shrine-gate shape) as illustrated in (b) of FIG. 1. The silicon deposition member 10 obtained by such a process is disposed with respect to the at least one pair of electrodes 4, and is connected to the at least one pair of electrodes 4 so that an electric current can be passed through to the silicon deposition member 10. Electric power is supplied from the electric power supplying section 5 to the silicon deposition member 10 via the at least one pair of electrodes 4 so that an electric current is passed through the silicon deposition member 10 and the silicon deposition member 10 is accordingly heated.

Polycrystalline silicon is deposited on a surface of the silicon deposition member 10. As a result, a polycrystalline silicon rod 8 is formed.

In FIG. 2, a plurality of silicon deposition members 10 are disposed in a standing manner in the chemical reactor 1, and a plurality of polycrystalline silicon rods 8 are formed. As has been described, according to a conventional method in which a silicon filament 11 is produced with use of the polycrystalline silicon rod 8 produced by the Siemens process, one of the plurality of polycrystalline silicon rods 8 is employed as a polycrystalline silicon rod 8a (filament production batch) for production of a silicon filament 11.

Note that a configuration of each section, other than the silicon filament 11 in accordance with an aspect of the present invention, of the chemical reactor 1 is not limited to any particular configuration, and a known technique can be employed as appropriate. Therefore, for convenience, detailed description of each section, other than the silicon filament 11, of the chemical reactor 1 will be omitted.

Next, findings as to the present invention will be briefly described below in regard to the silicon filament 11 used in the chemical reactor 1 as has been described.

Brief Description of Findings as to the Present Invention

Conventionally, in a case where polycrystalline silicon is produced by the Siemens process, various techniques (for example, (i) preheating a silicon filament, (ii) increasing a rate at which a temperature is increased, (iii) increasing a temperature and a pressure in a chemical reactor, (iv) increasing an amount of a source gas to be supplied, and (v) increasing a diameter of a polycrystalline silicon rod) have been suggested and applied in order that production efficiency is improved.

As has been described, generally, the silicon filament 11 can be produced by a method (i) in which the silicon filament 11 is cut out from the polycrystalline silicon rod 8a (see FIG. 2) which is a filament production batch and which has been produced by the Siemens process. The silicon filament 11 obtained by this method (hereinafter, also referred to as a "silicon filament obtained by the Siemens process") has a low impurity concentration and has a high quality. However, such a polycrystalline silicon rod 8a is required to be closely packed and rigid. Therefore, it is necessary to produce the polycrystalline silicon rod 8a under a loose reaction condition. This results in a decrease in efficiency of producing polycrystalline silicon. Moreover, it is necessary to produce the polycrystalline silicon rod 8a with use of the chemical reactor 1. This results in a decrease in efficiency of producing the polycrystalline silicon rod 8. Thus, according to the method (i), there is an economic disadvantage due to a decrease in production efficiency.

In view of the above, a technique of producing the silicon filament 11 by a method (ii) in which the silicon filament 11 is cut out from a single-crystal silicon ingot produced by the CZ method has been suggested. It is considered that the CZ method allows a silicon rod to be produced more easily than the Siemens process. The silicon filament 11 obtained by this method (hereinafter, also referred to as a "silicon filament obtained by the CZ method") contains relatively low impurities, and is easily produced. Therefore, the silicon filament 11 obtained by this method is widely accepted by a market.

By the way, in view of an increase in efficiency of depositing polycrystalline silicon, the inventors of the present invention consider it preferable to increase production efficiency per unit time by increasing a temperature of the silicon filament 11 from an initial stage of a deposition reaction so that a deposition rate can be increased from the initial stage of the deposition reaction. Further, by increasing the temperature of the silicon filament 11 from the initial stage of the deposition reaction, it is possible to prevent an oxide film from adhering to a surface of the silicon filament 11.

Here, the silicon filament obtained by the CZ method is prone to thermal deformation during an increase in temperature, in particular, creep deformation by a slip at a high temperature, due to its physical property that the silicon filament obtained by the CZ method is constituted by a single crystal. Specifically, at a temperature of not lower than 800° C., the silicon filament obtained by the CZ method may collapse in the chemical reactor 1 due to creep deformation. Therefore, such a silicon filament has the following problem. That is, it is difficult to use the silicon filament as a silicon filament which can withstand a reaction condition for a further improvement in efficiency of depositing polycrystalline silicon by the Siemens process, for example, a condition that a temperature is increased from an initial stage of a deposition reaction.

In order to suppress the above deformation, it is possible to increase mechanical strength by increasing a diameter of the silicon filament. However, in a case where the diameter of the silicon filament is increased, an excessive amount of energy is needed so as to keep a temperature of a surface of the silicon filament at a high temperature. Moreover, increasing the diameter of the silicon filament is not preferable from the viewpoint of production efficiency, because this results in that a decreased number of silicon filaments are cut out from a material (ingot) for production of a silicon filament.

Under the circumstances, the inventors of the present invention conducted diligent studies on what characteristic a silicon filament should have so that the silicon filament can be suitably used in the Siemens process.

A single-crystal silicon filament obtained by the CZ method is prone to thermal deformation during an increase in temperature. The inventors of the present invention considered as follows as one of causes. That is, the inventors of the present invention considered that, generally, since a single-crystal silicon ingot produced by the CZ method has a uniform crystal structure, a slip of a crystal tends to easily occur at a high temperature and, therefore, the single-crystal silicon ingot is not resistant to a stress in a specific direction. Accordingly, the inventors of the present invention conceived that, in order to improve a mechanical characteristic of the silicon filament at a high temperature, it is effective to arrange a structure of a material of the silicon filament so that the material has a plurality of crystal grains having random crystal orientations. Thus, the inventors of the present invention attempted to suppress a decrease in yield stress of the silicon filament with respect to a force applied from a specific direction and to make the yield stress of the silicon filament uniform.

Furthermore, the inventors of the present invention considered obtaining the following effect by, in order to increase strength of the above randomly arranged single-crystal grains themselves, (i) adjusting an interstitial oxygen concentration at each part of the silicon filament to a concentration at which deterioration of the mechanical characteristic, which deterioration is caused by, for example, deposition of oxygen, is difficult to occur and (ii) suppressing a variation of the concentration. That is, it is possible to suppress thermal deformation of the silicon filament during an increase in temperature before deposition is carried out by the Siemens process, by making the yield stress at each part of the silicon filament uniform and controlling an oxygen concentration so that the silicon filament has high strength.

Here, as a method for obtaining a polycrystalline silicon ingot, a method in which casting, such as an HEM (Heat Exchange Method), is carried out is well known. According to this method, it is possible to easily obtain a polycrystalline silicon ingot. However, the polycrystalline silicon ingot produced by this method contains a large number of impurities (contaminants) derived from a crucible and a casting furnace structure, and is therefore not preferable as an ingot for production of a silicon filament which is required to be highly pure. Furthermore, it is difficult to control inclusion of oxygen in the ingot, and is therefore extremely difficult to uniformly control an oxygen concentration of the ingot from a bottom of the ingot to a top of the ingot.

In view of the above, the inventors of the present invention further conducted diligent studies on a method for producing a silicon filament having a desired characteristic, on the basis of the above idea. As a result, the inventors of the present invention found the following new method. That is, the inventors of the present invention (i) used polycrystalline silicon as a seed crystal in the CZ method, which is conventionally exclusively employed to produce single-crystal silicon, (ii) used an apparatus similar to that used in the CZ method, and (iii) devised control of a temperature in an initial stage, a pulling up condition, a characteristic of the seed crystal, and the like. As a result, the inventors of the present invention found that it is possible to produce a polycrystalline silicon ingot having a desired characteristic. According to this method, it is possible to control an interstitial oxygen concentration in the polycrystalline silicon ingot in a case where the polycrystalline silicon ingot is pulled up. By cutting and processing the polycrystalline silicon ingot, it is possible to produce a silicon filament having the desired characteristic.

In this specification, a method for producing a polycrystalline silicon ingot, which method is involved in a new method for producing a silicon filament, will be referred to as a polycrystal CZ method for convenience.

The silicon filament in accordance with the present embodiment, which silicon filament is obtained by the polycrystal CZ method, is highly resistant to thermal deformation at a high temperature, and has an excellent mechanical characteristic at a high temperature of not lower than 900° C., as compared to the silicon filament obtained by the CZ method which has been conventionally suggested. Furthermore, the silicon filament in accordance with the present embodiment has the following characteristics; (i) a difference in oxygen concentration (interstitial oxygen concentration) between silicon filaments cut out is small; (ii) a variation of the oxygen concentration in a lengthwise direction of each of the silicon filaments is small; and (iii) each of the silicon filaments is highly pure.

Use of the silicon filament in accordance with the present embodiment makes it unnecessary to produce a silicon filament by the Siemens process. Moreover, it is possible to increase a temperature of the silicon filament from an initial stage of a reaction. This allows efficient deposition, and also allows a reduction in risk of collapse of the silicon filament due to deformation of the silicon filament before a start of deposition. Furthermore, it is possible to preheat the silicon filament in a chemical reactor with use of a carbon heater, and possible to suitably use the silicon filament in a high-pressure process in the Siemens process. Besides, since it is possible to suppress creep deformation at a high temperature, it is not necessary to increase a diameter of the silicon filament. Therefore, it is possible to improve efficiency of producing polycrystalline silicon.

Next, the silicon filament in accordance with an embodiment of the present invention will be described.

<Silicon Filament (Silicon Deposition Filament)>

Figure 3:
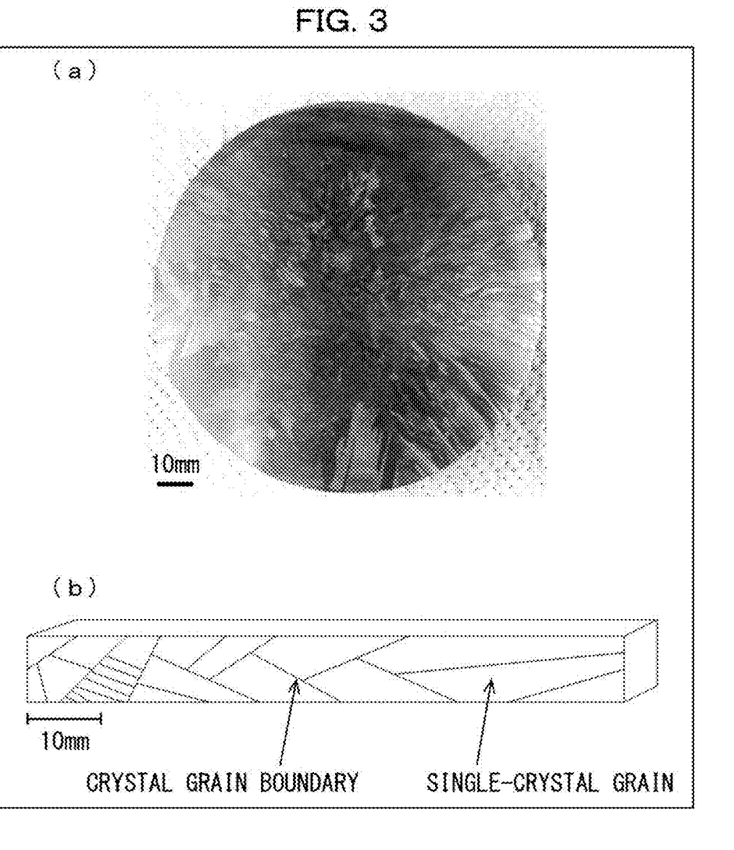

A silicon filament in accordance with an embodiment of the present invention will be described with reference to FIG. 3. (a) of FIG. 3 is a transverse cross-sectional view of a polycrystalline silicon ingot serving as a material from which the silicon filament is produced. (b) of FIG. 3 is a schematic view illustrating a side surface, in a lengthwise direction, of the silicon filament.

The silicon filament is constituted by a rod-shaped member made of polycrystalline silicon. The polycrystalline silicon has an interstitial oxygen concentration of not less than 10 ppma and not more than 40 ppma. On a side surface, in a lengthwise direction, of the rod-shaped member, crystal grains each having a crystal grain size of not less than 1 mm are observed.

The silicon filament can be produced by, for example, the following method. That is, the silicon filament can be produced by cutting and processing a polycrystalline silicon ingot which has an interstitial oxygen concentration adjusted to not less than 10 ppma and not more than 40 ppma and which contains crystal grains each having a crystal grain size of not less than 1 mm. A method for producing the polycrystalline silicon ingot will be later described in detail. A cross section (transverse cross section) of the polycrystalline silicon ingot, which cross section is perpendicular to a lengthwise direction of the polycrystalline silicon ingot, is illustrated in (a) of FIG. 3.

As illustrated in (a) of FIG. 3, it is found that, in the polycrystalline silicon ingot in accordance with the present embodiment, the crystal grains each having a maximum side length of not less than 1 mm are randomly dispersed although the crystal grains are different from each other in size. In contrast, crystals contained in a polycrystalline silicon ingot produced by the conventional Siemens process are extremely fine, and a crystal grain having a maximum side length of not less than 1 mm is not observed in the polycrystalline silicon ingot produced by the conventional Siemens process.

(Shape)

The silicon filament is obtained by cutting the polycrystalline silicon ingot and cutting out the rod-shaped member, which is made of polycrystalline silicon, from the polycrystalline silicon ingot thus cut. In so doing, each of an external shape of the silicon filament thus cut out and a shape of a vertical cross section of the silicon filament thus cut out is not limited to any particular shape. The silicon filament only needs to have such a shape that, in a case where the silicon filament is disposed in a standing manner in a chemical reactor 1 (see (a) of FIG. 1) and polycrystalline silicon is produced by the Siemens process, the polycrystalline silicon rod 8 having a desired diameter can be obtained.

A shape of the rod-shaped member of which the silicon filament is constituted is not limited to any particular one. For example, the rod-shaped member can have any one of a cylindrical shape, an elliptic cylinder shape, a substantially quadrangular pillar shape, and a polygonal pillar shape. A cross-sectional area of the silicon filament is more preferably not less than 0.1 $cm^2$ and not more than 6 $cm^2$, and a length of the silicon filament is more preferably not less than 0.5 m. The cross-sectional area of the silicon filament is still more preferably not less than 0.3 $cm^2$ and not more than 2 $cm^2$, and the length of the silicon filament is still more preferably not less than 1 m. Increasing a diameter of a silicon filament can suppress thermal deformation of the silicon filament at a high temperature. However, in this case, efficiency of producing polycrystalline silicon is decreased. In contrast, according to the above arrangement, it is possible to cause a size of the silicon filament to fall within a given range. Therefore, a decrease in efficiency of producing polycrystalline silicon does not occur.

(Interstitial Oxygen Concentration)

The silicon filament has an interstitial oxygen concentration falling within a range of not less than 10 ppma and not more than 40 ppma, from the viewpoint of prevention of deformation of the silicon filament during an increase in temperature. The range of the interstitial oxygen concentration is preferably not less than 15 ppma and not more than 35 ppma, and more preferably not less than 20 ppma and not more than 30 ppma.

Distribution of the interstitial oxygen concentration in the lengthwise direction of the rod-shaped member is such that, in a case where the interstitial oxygen concentration at any location in the lengthwise direction is regarded as a reference, the interstitial oxygen concentration varies by preferably not more than ±5 ppma/m with respect to the reference. Such a variation is more preferably not more than ±3 ppma/m, and still more preferably not more than ±1 ppma/m. This means that, for example, an absolute value of a difference between (i) the interstitial oxygen concentration measured at any location of the rod-shaped member and (ii) the interstitial oxygen concentration measured at a location 1 m apart from the any location is not more than 5 ppma.

Note, here, that the interstitial oxygen concentration can be measured with use of a publicly known measuring device. For example, a Fourier transform infrared spectrophotometer can be used.

According to the above arrangement, it is possible to suppress thermal deformation of the silicon filament at a high temperature which thermal deformation can be caused in a case where the interstitial oxygen concentration greatly varies throughout the whole length of the silicon filament.

(Appearance of Side Surface)

Crystals contained in the silicon filament will be described with reference to (b) of FIG. 3. The silicon filament is constituted by the rod-shaped member made of polycrystalline silicon which is an aggregate of silicon crystals. As illustrated in (b) of FIG. 3, many single-crystal grains each having a maximum side length of not less than 1 mm are observed on the side surface, in the lengthwise direction, of the silicon filament.

From the other viewpoint, it can be said that, according to the silicon filament, cross sections (crystal grain cross sections), which are obtained by making a cut, of the crystal grains each having a maximum side length of not less than 1 mm account for not less than 95% of an area of a single side surface (side surface area), in the lengthwise direction, of the silicon filament.

A shape of each of the crystal grains observed on the side surface of the silicon filament is not limited to any particular one, and can vary depending on how each of the crystal grains appears on the side surface. For example, it is assumed that each of the crystals has an acicular shape. In this case, in a case where each of the crystals lies in a lengthwise direction of the side surface, the shape of each of the crystals observed on the side surface is an acicular shape. Depending on a degree to which each of such acicular crystals rises, the shape of each of the crystals observed on the side surface varies to a substantially elliptic shape or a substantially circular shape. Therefore, in an embodiment of the present invention, the maximum side length of each of the crystal grains is equivalent to a length of a major axis of a corresponding one of the crystal grain cross sections on an observed surface (in a case where each of the crystal grains has an irregular shape such as an acicular shape and a substantially elliptic shape). In a case where each of the crystal grain cross sections has a substantially circular shape, a diameter of each of the crystal grain cross sections is equivalent to the maximum side length.

The crystal grains observed on the side surface of the silicon filament include a crystal grain having a maximum side length of not less than 1 mm and not more than 300 mm. The crystal grains observed on the side surface of the silicon filament more preferably include a crystal grain having a maximum side length of not less than 1 mm and not more than 100 mm.

Further, the crystal grain cross sections each having a maximum side length of not less than 1 mm still more preferably account for not less than 50% of the area of the single side surface, in the lengthwise direction, of the silicon filament.

Note, here, that a proportion of the crystal grain cross sections to the side surface can be measured with use of a publicly known measuring device. For example, a length measuring apparatus can be used. Alternatively, the crystal grain cross sections on the side surface can be observed with use of an optical microscope.

The silicon filament produced by the polycrystal CZ method is thus greater, in crystal grain size, than a silicon filament obtained by the Siemens process. This can mean that the silicon filament produced by the polycrystal CZ method is relatively easily softened during an increase in temperature. Note, here, that the interstitial oxygen concentration of the silicon filament is adjusted and some oxygen is taken into a grain boundary of polycrystalline silicon. This suppresses softening of the silicon filament during the increase in temperature.

(Yield Stress)

The silicon filament has a yield stress of preferably not less than 150 MPa per square centimeter at 900° C. It is possible to achieve such a mechanical characteristic (strength at a high temperature) by (i) constituting the silicon filament by the rod-shaped member made of polycrystalline silicon and (ii) causing the interstitial oxygen concentration to fall within the above described given range. According to the above arrangement, it is possible to suppress thermal deformation of the silicon filament at a high temperature, and possible to carry out a silicon depositing step at a high temperature from an initial stage of a reaction. The yield stress means a stress which ceases being in proportion to an amount of deformation and causes permanent deformation.

Note, here, that the yield stress can be measured with use of a publicly known measuring device. For example, a three-point bend test according to JIS Z 2248 is employed.

(Impurity Concentration)

A total concentration (dopant concentration) of phosphorus and boron, which are contained in the silicon filament, is preferably not more than 1 ppba. In this case, it is possible to cause purity of polycrystalline silicon, obtained by the Siemens process with use of the silicon filament, to be higher. Therefore, it is possible to suitably use the polycrystalline silicon for a semiconductor.

Note, here, that the above impurities can be measured with use of a publicly known measuring device. For example, a photoluminescence technique is employed.

The total concentration of phosphorus and boron, which are contained in the silicon filament, is basically dependent on a total concentration of phosphorus and boron, which are contained in the polycrystalline silicon ingot. The polycrystalline silicon ingot can be produced in a polycrystalline silicon ingot producing step (later described) so that the total concentration of phosphorus and boron is decreased.

Note that another chemical element (for example, C) can be added to the silicon filament so that the silicon filament has a desired function depending on use application of the silicon filament. Such addition of a chemical element and adjustment of a concentration can be relatively easily carried out in the polycrystalline silicon ingot producing step (later described).

As has been described, according to the silicon filament, it is not necessary to provide a filament production batch as in the conventional method. Therefore, it is possible to produce the silicon filament, simultaneously with production of polycrystalline silicon in the chemical reactor 1 (apparatus for producing polycrystalline silicon by the Siemens process). This ultimately allows acceleration of a cycle of production of polycrystalline silicon in the chemical reactor 1 and thereby allows improvement in production efficiency.

Furthermore, it is possible to, in the chemical reactor 1, (i) increase a temperature of the silicon filament from an initial stage of a polycrystalline silicon deposition reaction and (ii) reduce a risk of collapse of the silicon filament which collapse is caused by deformation of the silicon filament. This allows the polycrystalline silicon deposition reaction to proceed under an efficient deposition condition.

Therefore, use of the silicon filament allows improvement in efficiency of producing polycrystalline silicon.

<Method for Producing Silicon Filament>

Figure 4:
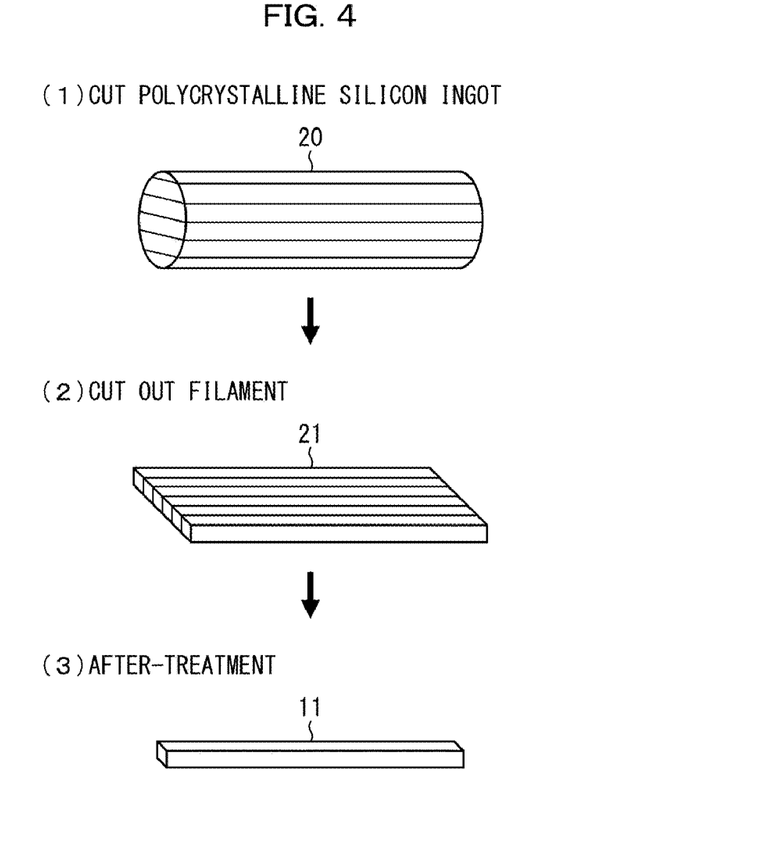
FIG. 4 is a view illustrating an example method for producing a silicon filament in accordance with an embodiment of the present invention.

An example method for producing the silicon filament will be described with reference to FIG. 4. FIG. 4 is a view illustrating an example method for producing the silicon filament.

The method for producing the silicon filament is a method including: an ingot producing step of producing a polycrystalline silicon ingot, which contains crystal grains each having a crystal grain size of not less than 1 mm and which has an interstitial oxygen concentration of not less than 10 ppma and not more than 40 ppma, by the Czochralski method with use of polycrystalline silicon as a seed crystal; and a processing step of processing the polycrystalline silicon ingot into a rod-shaped member.

As the processing step, the method for producing the silicon filament at least includes: (1) a step of cutting an ingot; (2) a step of cutting out a filament; and (3) an after-treatment step.

(Ingot Producing Step)

In the ingot producing step, generally, it is possible to use a publicly known polycrystalline silicon ingot pulling up device (hereinafter, referred to as an ingot producing device) which is used in the Czochralski method. A structure of the ingot producing device is not limited to any particular one.

In the ingot producing step, first, a silicon feedstock for production of the polycrystalline silicon ingot is put in a crucible provided in the ingot producing device. As the silicon feedstock, polycrystalline silicon is typically used. The silicon feedstock is not limited to any particular one, but is preferably one that is highly pure and is less contaminated with metal, from the viewpoint of a fact that a silicon filament, to be used in the Siemens process, is produced with use of the polycrystalline silicon ingot produced in the ingot producing step.

Note that the silicon feedstock can contain crushed (scrapped) polycrystalline silicon generated in, for example, the processing step (later described) and the after-treatment step of carrying out after-treatment with respect to a polycrystalline silicon rod produced by the Siemens process. This allows improvement in overall stock utilization in a polycrystalline silicon producing step.

Note also that a material of the crucible is not limited to any particular one. However, a quartz crucible which has a surface coated with SiC is preferably used, from the viewpoint of a decrease in amount of oxygen included in the polycrystalline silicon ingot.

After the silicon feedstock is put into the crucible, the crucible is heated so that a silicon melted solution is obtained. A temperature to which the crucible is heated is not limited to any particular one, provided that the temperature is a temperature at which the silicon feedstock can be melted.

Next, polycrystalline silicon serving as a seed crystal is mounted on a holder, and the seed crystal is immersed in the silicon melted solution. After the seed crystal is immersed in the silicon melted solution, various pulling up conditions are controlled so that a crystal size of the seed crystal is expanded to a desired size. After the seed crystal is grown until the seed crystal has the desired crystal size, a body of the seed crystal is pulled up in such a manner that the crystal size is maintained.

The polycrystalline silicon used as the seed crystal is not limited to any particular one, but is preferably highly pure polycrystalline silicon produced by the Siemens process.

Here, examples of the various pulling up conditions include a rotation speed of the crucible, a rate at which the seed crystal is pulled up, and a temperature of the crucible. In the ingot producing step, it is possible to employ, as those conditions, publicly known pulling up conditions which are employed in the conventional Czochralski method and under which a single crystal is used as a seed crystal, without any particular limitation.

Throughout the production of the polycrystalline silicon ingot, the ingot producing device is controlled so that the ingot producing device has therein an inert atmosphere. For example, the ingot producing device has therein an argon atmosphere, and an oxygen concentration in the ingot producing device is low. Further, convection of the silicon melted solution can be controlled by feeding an argon gas to a surface of the silicon melted solution. This makes it possible to (i) reduce transfer of oxygen from the crucible to the silicon melted solution, (ii) promote discharge of oxygen dissolved in the silicon melted solution, and (iii) thereby control the oxygen concentration.

A diameter of the polycrystalline silicon ingot is preferably 90 mm to 180 mm, and more preferably 110 mm to 160 mm. As the diameter of the polycrystalline silicon rod is increased, the increased number of raw materials are obtained in a single production step, that is, a larger number of silicon filaments are produced by a single production step.

By such an ingot producing step, it is possible to produce the polycrystalline silicon ingot which has a controlled interstitial oxygen concentration and which contains impurities at a low concentration. Furthermore, according to the ingot producing step, it is possible to produce, from an initial stage of pulling up, the polycrystalline silicon ingot which has a plurality of crystal grains having random crystal orientations.

Specifically, it is possible to produce the polycrystalline silicon ingot which contains crystal grains each having a crystal grain size of not less than mm and which has an interstitial oxygen concentration of not less than 10 ppma and not more than 40 ppma. Furthermore, according to this polycrystalline silicon ingot, a variation of the interstitial oxygen concentration in a lengthwise direction of the polycrystalline silicon ingot is small. In other words, it is possible to cause distribution of the interstitial oxygen concentration in the lengthwise direction of the polycrystalline silicon ingot to be such that, in a case where the interstitial oxygen concentration at any location in the lengthwise direction is regarded as a reference, the interstitial oxygen concentration varies by not more than ±5 ppma/m with respect to the reference.

The processing step of processing the polycrystalline silicon ingot, produced in the ingot producing step, into the rod-shaped member will be described below. Note that an apparatus and the like, similar to those used in the conventional method for cutting out a silicon filament from a polycrystalline silicon rod and a single-crystal silicon ingot, can be used in the step described below, and therefore will not be described in detail.

(1) Step of Cutting Ingot

In the step of cutting the polycrystalline silicon ingot, a polycrystalline silicon ingot 20, produced by the method in accordance with the present embodiment, is cut as follows, as illustrated in "(1) Cut polycrystalline silicon ingot" in FIG. 4. That is, the polycrystalline silicon ingot 20 is cut in a direction parallel to a lengthwise direction of the polycrystalline silicon ingot 20 so that a plurality of planar plates are cut out from the polycrystalline silicon ingot 20. In other words, the polycrystalline silicon ingot 20 is cut so that a lengthwise direction of each of the plurality of planar plates cut out corresponds to a direction in which the polycrystalline silicon ingot 20 has been pulled up during production of the polycrystalline silicon ingot 20.

As a method for cutting the polycrystalline silicon ingot 20, it is possible to use, for example, a diamond wire saw.

(2) Step of Cutting Out Filament

In the step of cutting out a filament, a planar plate 21 cut out from the polycrystalline silicon ingot 20 is further cut so that a rod-shaped member is cut out from the planar plate 21, as illustrated in "(2) Cut out filament" in FIG. 4. A shape of the rod-shaped member thus obtained is not limited to any particular one.

Note that each of the steps (1) and (2) can include, as appropriate, a step of carrying out surface treatment, such as a grinding step and an etching step.

(3) After-Treatment Step

In the after-treatment step, after-treatment is carried out with respect to the rod-shaped member cut out so that a silicon filament 11 is produced, as illustrated in "(3) After-treatment" in FIG. 4.

As the after-treatment, it is possible to carry out treatment publicly known in production of a silicon filament. Furthermore, it is possible to produce a silicon deposition member 10 by coupling a plurality of silicon filaments 11 before the plurality of silicon filaments 11 are used for production of polycrystalline silicon by the Siemens process.

The polycrystalline silicon ingot 20 does not easily have a cleavage, unlike a single-crystal silicon ingot. Therefore, it is possible to relatively easily carry out processing in the processing step. This makes it possible to prevent a decrease in yield which decrease is caused by damage that can occur in the processing step.

Furthermore, in a case where the silicon filament is produced by the above steps, that is, by producing the polycrystalline silicon ingot 20 with use of a highly pure silicon feedstock and then processing the polycrystalline silicon ingot 20 thus produced, it is possible to reduce contamination with an impurity. Therefore, it is possible to produce a silicon filament which can be sufficiently used for production of a polycrystalline silicon rod for use in a semiconductor. Moreover, it is possible to produce a silicon filament which has a sufficient quality for PV use such as photovoltaic power generation.

<Method for Producing Polycrystalline Silicon>

A method for producing polycrystalline silicon in accordance with an aspect of the present invention includes the steps of: connecting a silicon deposition member 10 (silicon deposition filament), obtained by coupling silicon filaments as has been described, to at least one pair of electrodes 4 provided on a bottom plate of a chemical reactor 1 (connecting step); and depositing silicon on a surface of the silicon deposition member 10 by supplying electric power to the silicon deposition member 10 so that the silicon deposition member 10 is heated, while feeding a source gas, containing (i) a gas of a silane compound and (ii) hydrogen, to the chemical reactor 1 (depositing step).

Note that a silicon filament 11 can be alternatively used instead of the silicon deposition member 10.

As the connecting step and the depositing step, conventionally publicly known methods can be employed, except that the silicon deposition member 10, obtained by coupling the silicon filaments in accordance with an aspect of the present invention, is used as the silicon deposition member 10.

An outline of the depositing step will be described below.

Supply of electric power to the silicon deposition member 10 is started via the at least one pair of electrodes 4 so that the silicon deposition member 10 is heated to a temperature equal to or higher than a silicon deposition temperature. The silicon deposition temperature is approximately not lower than 600° C. From the viewpoint of prompt deposition of silicon on the silicon deposition member 10, the silicon deposition member 10 is heated, by supplying electric power to the silicon deposition member 10, so that the temperature is kept at approximately 900° C. to 1000° C. Note, here, that it is preferable to preheat the silicon deposition member 10 with use of a carbon heater (not illustrated) provided in the chemical reactor 1.

Heating of the silicon deposition member 10 by supply of electric power can be carried out while the source gas is being fed into the chemical reactor 1. The source gas contains (i) a gas of a silane compound and (ii) hydrogen. A reaction of the source gas, that is, a reduction reaction of a silane compound causes generation of silicon.

As the gas of a silane compound, a gas of a silane compound such as monosilane, trichlorosilane, silicon tetrachloride, monochlorosilane, and dichlorosilane is used. Generally, a trichlorosilane gas is suitably used. The hydrogen is used as a reducing gas. As the reducing gas, a gas other than the hydrogen can be used. Note that, in the source gas, the reducing gas (hydrogen gas) is generally excessively used.

In a case where an example in which the trichlorosilane gas and the hydrogen gas are used is taken, this reduction reaction is represented by the following expression.

By the above method, polycrystalline silicon is deposited on the surface of the silicon deposition member 10, and a polycrystalline silicon rod 8 is obtained.

SUMMARY

As has been described, the present invention encompasses the following inventions.

[1] A silicon deposition filament, the silicon deposition filament being constituted by a rod-shaped member made of polycrystalline silicon, the polycrystalline silicon having an interstitial oxygen concentration of not less than 10 ppma and not more than 40 ppma, on a side surface, in a lengthwise direction, of the rod-shaped member, crystal grains each having a crystal grain size of not less than 1 mm being observed.

[2] The silicon deposition filament described in [1], wherein distribution, in the lengthwise direction of the rod-shaped member, of the interstitial oxygen concentration of the polycrystalline silicon is such that, in a case where the interstitial oxygen concentration at any location in the lengthwise direction is regarded as a reference, the interstitial oxygen concentration varies by not more than ±5 ppma/m with respect to the reference.

[3] The silicon deposition filament described in [1] or [2], wherein the silicon deposition filament has a yield stress of not less than 150 MPa per square centimeter at 900° C.

[4] The silicon deposition filament described in any one of [1] through [3], wherein a total concentration of phosphorus and boron, which are contained in the polycrystalline silicon, is not more than 1 ppba.

[5] The silicon deposition filament described in any one of [1] through [4], wherein a cross-sectional area of the silicon deposition filament is not less than 0.1 cm² and not more than 6 cm², and a length of the silicon deposition filament is not less than 0.5 m.

[6] A method for producing a silicon deposition filament, the method including the steps of: producing a polycrystalline silicon ingot, which contains crystal grains each having a crystal grain size of not less than mm and which has an interstitial oxygen concentration of not less than 10 ppma and not more than 40 ppma, by a Czochralski method in which polycrystalline silicon is used as a seed crystal; and processing the polycrystalline silicon ingot into a rod-shaped member.

[7] A method for producing polycrystalline silicon, the method including the steps of: connecting a silicon deposition filament, described in any one of [1] through [5], to at least one pair of electrodes provided on a bottom plate of a chemical reactor for producing polycrystalline silicon; and depositing silicon on a surface of the silicon deposition filament by supplying electric power to the silicon deposition filament so that the silicon deposition filament is heated, while feeding a source gas, containing (i) a gas of a silane compound and (ii) hydrogen, to the chemical reactor.

EXAMPLES

The present invention will be described below in more detail on the basis of Examples. Note, however, that the present invention is not limited to such Examples.

Examples 1 and 2

Polycrystalline silicon ingots were each produced in accordance with a procedure of the Czochralski method as described below. First, 55 kg of highly pure polycrystalline silicon having a dopant concentration of not more than 1 ppba was introduced into a crucible made of quartz. The crucible was set in a Czochralski type pulling up furnace, and crystals were grown. The polycrystalline silicon ingots thus obtained each had a diameter of 100 mm and a length of 2400 mm. The polycrystalline silicon ingots were each cut into 8 mm square pieces. Silicon filaments were thus obtained.

An interstitial oxygen concentration of each of the polycrystalline silicon ingots was measured with use of a Fourier transform infrared spectrophotometer. As a result, the interstitial oxygen concentration in a widthwise direction of each of the polycrystalline silicon ingots was not less than 15 ppma and not more than 30 ppma. Distribution of the interstitial oxygen concentration in a lengthwise direction of each of the polycrystalline silicon ingots was such that, in a case where the interstitial oxygen concentration measured at any location was regarded as a reference, a difference between the interstitial oxygen concentration measured at another location and the reference was not more than ±5 ppma/m. Specifically, the following silicon filaments were cut out. That is, distribution of an interstitial oxygen concentration in a lengthwise direction of each of the silicon filaments was such that the interstitial oxygen concentration varied by not more than ±5 ppma/m with respect to a reference. Furthermore, an average interstitial oxygen concentration in the lengthwise direction of one of the silicon filaments was 26 ppma, and the interstitial oxygen concentration in the lengthwise direction of the other one of the silicon filaments was 16 ppma.

A proportion of contained crystal grains to a side surface area of each of the silicon filaments was measured with use of an optical microscope. Note that, in Examples 1 and 2, crystal grains each having a maximum side length of not less than 1 mm was subjected to measurement. According to each of the silicon filaments, cross sections, obtained by making a cut, of the crystal grains each having a maximum side length of not less than 1 mm accounted for not less than 95% of the side surface area. Furthermore, each of the silicon filaments contained, on a side surface, 2 or more and 25 or less crystal grains per square centimeter.

(Evaluation of Amount of Warp and Amount of Plastic Deformation)

How to evaluate (i) an amount of a warp (hereinafter, referred to as a warp amount) in a silicon filament at a high temperature and (ii) an amount of plastic deformation (hereinafter, referred to as a plastic deformation amount) of the silicon filament will be described with reference to FIG. 5.

Figure 5:
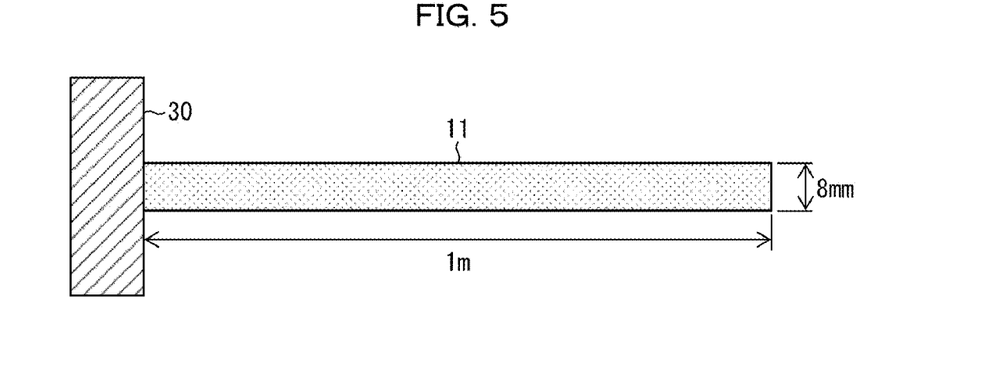
FIG. 5 is a cross-sectional view illustrating a method for testing a warp amount of a silicon filament at a high temperature.

As illustrated in FIG. 5, one end of a silicon filament 11, having a diameter of 8 mm (8 mm square) in a widthwise direction, was held and fixed with use of a holding member 30. Here, part of the silicon filament 11 which part was not held by the holding member 30 was caused to have a length of 1 m. The silicon filament 11 was heated for 1 hour at 900° C. while a state of the silicon filament 11 and the holding member 30, which were arranged so that a lengthwise direction of the silicon filament 11 corresponded to a horizontal direction (direction perpendicular to a direction of gravity), was maintained.

At a time point at which the silicon filament 11 had been heated for 1 hour at 900° C., an amount of a shift of the other end (which is not held, open end) of the silicon filament 11 from an initial location was measured as a warp amount after an increase in temperature to 900° C. In other words, the warp amount indicates a distance between (i) the center of the open end of the silicon filament 11 and (ii) a straight line extending, from the center of the one end of the silicon filament 11, in a direction perpendicular to a surface of the holding member 30 from which surface the silicon filament 11 protrudes.

After the silicon filament 11 was heated for 1 hour at 900° C., the silicon filament 11 was cooled to a room temperature, and then measurement was carried out by a method identical to the above method for measuring a warp amount. A value thus obtained was regarded as a plastic deformation amount. As a result, warp amounts, after an increase in temperature to 900° C., of the above silicon filaments 11 were 13.8 mm and 13 mm, and plastic deformation amounts, after heating, of the above silicon filaments 11 were each 0 (zero) mm.

Moreover, a total concentration of phosphorus and boron, which were contained in each of the above silicon bulks, was measured by the photoluminescence method. As a result, the total concentration of the phosphorus and the boron was not more than 1 ppba, similarly to the polycrystalline silicon serving as a raw material. Thus, it was found that the each of the silicon filaments 11 was highly pure.

From the above results, it was demonstrated that thermal deformation, after an increase in temperature to 900° C., of each of the silicon filaments in Examples 1 and 2 was suppressed and that, in a step of depositing silicon by the Siemens process, it was possible to carry out a deposition reaction at a high temperature from an initial stage of the deposition reaction.

In a case where the silicon filaments obtained in Examples 1 and 2 were each used for a chemical reactor for producing polycrystalline silicon by the Siemens process, the silicon filaments exhibited physical properties similar to those shown by the above test results. Thus, it was found that the silicon filaments obtained in Examples 1 and 2 each have sufficient strength in a step of producing polycrystalline silicon by the Siemens process.

Comparative Examples 1 and 2

Single-crystal silicon ingots and silicon filaments were each obtained in accordance with a procedure of the Czochralski method, which procedure was similar to that in Example 1, except that single-crystal silicon was used as a seed crystal. Physical properties of the silicon filaments thus obtained were evaluated by methods similar to those in Example 1.

An interstitial oxygen concentration of each of the single-crystal silicon ingots was measured with use of a Fourier transform infrared spectrophotometer. The interstitial oxygen concentration in a widthwise direction of each of the single-crystal silicon ingots was not less than 15 ppma and not more than 30 ppma. Distribution of the interstitial oxygen concentration in a lengthwise direction was such that, in a case where the interstitial oxygen concentration at any location was regarded as a reference, the interstitial oxygen concentration varied by not more than ±5 ppma/m with respect to the reference.

A proportion of contained crystal grains to a side surface area of each of the silicon filaments obtained was measured. A crystal grain having a maximum side length of not less than 1 mm was not observed on the side surface area of each of the silicon filaments obtained.

As a result of measuring an interstitial oxygen concentration of each of the above single-crystal silicon filaments, the following single-crystal silicon filaments were cut out. That is, distribution of the interstitial oxygen concentration in a lengthwise direction of each of the single-crystal silicon filaments was such that the interstitial oxygen concentration varied by not more than ±5 ppma/m with respect to a reference. Furthermore, an average interstitial oxygen concentration in the lengthwise direction of one of the single-crystal silicon filaments was 28 ppma, and the interstitial oxygen concentration in the lengthwise direction of the other one of the single-crystal silicon filaments was 18 ppma.

As a result of measuring a plastic deformation amount of each of the silicon filaments, warp amounts, after an increase in temperature to 900° C., of the silicon filaments were each approximately 44 mm, and plastic deformation amounts, after heating, of the silicon filaments were each approximately 30 mm.

A total concentration of phosphorus and boron, which were contained in each of the silicon filaments, was measured. As a result, the total concentration of the phosphorus and the boron was not more than 1 ppba.

From the above results, according to the silicon filaments obtained in Comparative Examples 1 and 2, it was assumed that, in a step of depositing silicon by the Siemens process, it would be difficult to carry out a deposition reaction at a high temperature from an initial stage of the deposition reaction.

Comparative Example 3

A polycrystalline silicon ingot was produced in accordance with a procedure of the HEM as described below. First, 500 kg of highly pure polycrystalline silicon having a dopant concentration of not more than 1 ppba was introduced into a crucible made of quartz. The crucible was set in an HEM-type refining furnace, and a temperature of the polycrystalline silicon was increased to a temperature equal to or more than a melting point of the polycrystalline silicon. After the polycrystalline silicon was melted, a polycrystalline ingot, in which crystals had random crystal orientations and which had a length of 2700 mm, a width of approximately 300 mm, and a height of approximately 300 mm, was obtained by unidirectional solidification from a bottom part of the crucible. The polycrystalline silicon ingot thus obtained was cut into 8 mm square pieces. A silicon filament having an average oxygen concentration of 50 ppma in a lengthwise direction was thus obtained.

A proportion of contained crystal grains to a side surface area of the silicon filament was measured with use of an optical microscope. Note that crystal grains each having a maximum side length of not less than 1 mm was subjected to measurement. According to the silicon filament, cross sections, obtained by making a cut, of the crystal grains each having a maximum side length of not less than 1 mm accounted for not less than 95% of the side surface area. Furthermore, the silicon filament contained, on a side surface, 2 or more and 25 or less crystal grains per square centimeter.

As a result of measuring a plastic deformation amount of the silicon filament, the plastic deformation amount, after heating, of the silicon filament was 20 mm. Further, a warp amount, after an increase in temperature to 900° C., of the silicon filament was 33.9 mm.

A total concentration of phosphorus and boron, which were contained in the silicon filament, was measured. As a result, the total concentration of the phosphorus and the boron was more than 10 ppba.

From the above results, according to the silicon filament obtained in Comparative Example 3, it was assumed that, in a step of depositing silicon by the Siemens process, it would be difficult to carry out a deposition reaction at a high temperature from an initial stage of the deposition reaction. Furthermore, it was found that the silicon filament obtained in Comparative Example 3 has a high dopant concentration.

Referential Example

A polycrystalline silicon rod and a silicon filament were obtained by the Siemens process.

First, a hydrogen gas and a gaseous chlorosilane compound were fed, as a source gas, into a bell jar, and deposition of polycrystalline silicon was carried out. The polycrystalline silicon rod thus obtained was cut into 8 mm square pieces. A silicon filament was thus obtained.

Physical properties of the silicon filament were evaluated by methods similar to those in Example 1.

A proportion of contained crystal grains, each having a maximum side length of not less than 1 mm, to a side surface of the silicon filament was measured. A crystal grain having a maximum side length of not less than 1 mm was not observed on the side surface of the silicon filament.

As a result of measuring an interstitial oxygen concentration of the silicon filament, the interstitial oxygen concentration was less than 1 ppma.

As a result of measuring a plastic deformation amount of the silicon filament, the plastic deformation amount, after heating, of the silicon filament was 0 (zero) mm. Further, a warp amount, after an increase in temperature to 900° C., of the silicon filament was 11.8 mm.

A total concentration of phosphorus and boron, which were contained in the silicon filament, was measured. As a result, the total concentration of the phosphorus and the boron was not more than 1 ppba.

Table 1 collectively shows results of those Examples, Comparative Examples, and Referential Example.

TABLE 1

| | Growing method | Proportion of cross sections, obtained by making cut, of crystal grains of not less than 1 mm to side surface area (%) | Average oxygen concentration in lengthwise direction (ppma) | Warp amount after increase in temperature to 900° C. (mm) | Plastic deformation amount (mm) |
|---|---|---|---|---|---|
| Example 1 | Polycrystal CZ | >95 | 26 | 13.8 | 0 |
| Example 2 | Polycrystal CZ | >95 | 16 | 13 | 0 |
| Comparative Example 1 | Single crystal CZ | 0 | 28 | 43 | 30 |
| Comparative Example 2 | Single crystal CZ | 0 | 18 | 44 | 31 |
| Referential Example | Polycrystal Siemens | 0 | <1 | 11.8 | 0 |
| Comparative Example 3 | Polycrystal HEM | >95 | 50 | 33.9 | 20 |

The present invention is not limited to the above embodiments, but may be altered in various ways by a skilled person within the scope of the claims. The technical scope of the present invention also encompasses any embodiment based on a proper combination of technical means disclosed in different embodiments.

REFERENCE SIGNS LIST

1 Chemical reactor (chemical reactor for producing polycrystalline silicon)
2 Bottom plate
3 Cover
4 Electrode
8 Polycrystalline silicon rod
10 Silicon deposition member
11 Silicon filament (silicon deposition filament)

What is claimed is:

1. A silicon deposition filament,
the silicon deposition filament being constituted by a rod-shaped member made of polycrystalline silicon,
the polycrystalline silicon having an interstitial oxygen concentration of not less than 10 ppma and not more than 40 ppma,
on a side surface, in a lengthwise direction, of the rod-shaped member, crystal grains each having a crystal grain size of not less than 1 mm being observed,
distribution, in the lengthwise direction of the rod-shaped member, of the interstitial oxygen concentration of the polycrystalline silicon being such that, in a case where the interstitial oxygen concentration at any location in the lengthwise direction is regarded as a reference, the interstitial oxygen concentration varies by not more than ±5 ppma/m with respect to the reference,
a cross-sectional area of the silicon deposition filament being not less than 0.1 cm$^2$ and not more than 6 cm$^2$; and
a length of the silicon deposition filament being not less than 0.5 m.

2. The silicon deposition filament as set forth in claim 1, wherein the silicon deposition filament has a yield stress of not less than 150 MPa per square centimeter at 900° C.

3. The silicon deposition filament as set forth in claim 1, wherein a total concentration of phosphorus and boron, which are contained in the polycrystalline silicon, is not more than 1 ppba.

4. A method for producing polycrystalline silicon, the method comprising the steps of:
connecting a silicon deposition filament, recited in claim 1, to at least one pair of electrodes provided on a bottom plate of a chemical reactor for producing polycrystalline silicon; and
depositing silicon on a surface of the silicon deposition filament by supplying electric power to the silicon deposition filament so that the silicon deposition filament is heated, while feeding a source gas, containing (i) a gas of a silane compound and (ii) hydrogen, to the chemical reactor.

* * * * *